(12) United States Patent
Kunde et al.

(10) Patent No.: US 6,326,781 B1
(45) Date of Patent: Dec. 4, 2001

(54) 360 DEGREE SHAFT ANGLE SENSING AND REMOTE INDICATING SYSTEM USING A TWO-AXIS MAGNETORESISTIVE MICROCIRCUIT

(75) Inventors: John Kunde, Machesney Park; Gary Frederick, Rockford, both of IL (US)

(73) Assignee: BVR Aero Precision Corp, Rockford, IL (US)

( * ) Notice: Subject to any disclaimer, the term of this patent is extended or adjusted under 35 U.S.C. 154(b) by 0 days.

(21) Appl. No.: 09/231,690

(22) Filed: Jan. 11, 1999

(51) Int. Cl.$^7$ .................................................... G01B 7/14

(52) U.S. Cl. ................................ 324/207.21; 324/207.25; 324/144; 338/32 R (58) Field of Search .......................... 324/207.21, 207.12, 324/207.2, 207.25, 252, 154 R, 151, 144, 145, 146, 167, 228; 338/32 R, 32 H (56) References Cited

U.S. PATENT DOCUMENTS

| | | |
|---|---|---|
| 4,712,064 | 12/1987 | Eckardt . |
| 4,737,710 | * 4/1988 | Van Antwerp et al. .......... 324/207.2 |
| 4,791,366 | * 12/1988 | Suzuki et al. ................... 324/207.25 |
| 5,255,442 | 10/1993 | Schierbeek . |
| 5,430,375 | 7/1995 | Inoue . |
| 5,435,070 | 7/1995 | Kilian . |
| 5,444,369 | 8/1995 | Luetzow . |
| 5,453,684 | * 9/1995 | Nakayama ...................... 324/207.12 |
| 5,477,143 | 12/1995 | Wu . |

(List continued on next page.)

FOREIGN PATENT DOCUMENTS

| | | |
|---|---|---|
| 0 217 478 B1 | 1/1986 | (EP) . |
| WO 98/45665 | 4/1997 | (WO) . |
| WO 98/54547 | 5/1997 | (WO) . |

OTHER PUBLICATIONS

Honeywell Product Data Sheets, 1 & 2 Axis Magnetoresistive Microcircuits HMC1021/1022, pp. 1–4.

*Primary Examiner*—Safet Metjahic
*Assistant Examiner*—Subhash Zaveri
(74) *Attorney, Agent, or Firm*—Keith Frantz (57) ABSTRACT

A system for sensing and indicating the angular position of a shaft through 360 degrees of rotation using a two-axis magnetoresistive microcircuit, a two pole magnet which rotates with the input shaft, a two channel operational amplifier, and an electromechanical device such as air core meter indicator, or an electronic computer to provide remote shaft angle indication. The magnetoresistive microcircuit consists of two Wheatstone bridges with magnetic field sensitive resistor elements. The two pole magnet is attached to the input shaft and configured to provide a uniform, low level magnetic field with maximum intensity less than that which will saturate the magnetoresistive sensors. Operational amplifier circuits are trimmed to eliminate sensor offset, match scale factors for the two channels, and amplify the differential bridge sensor signals. As the input shaft rotates, sinusoidal signals $V_1$ and $V_2$ are obtained from the amplifiers with equal amplitude and a 90-degree phase shift. These signals may be transmitted to an analog-to-digital converter and microprocessor for calculating the indicated shaft angle $\theta_{in}$ by using the algorithm $\theta_{in}$=arctangent $(V_1/V_2)$. For mechanically repeating or indicating the angle of the shaft, $V_1$ and $V_2$ can be utilized to directly drive an air core meter. The air core meter consists of a two pole magnet attached to an indicator rotor shaft, and a pair of fixed electromagnetic coils would around the rotor shaft and wound at right angles to each other. The coils are energized by $V_1$ and $V_2$, respectively, causing the permanent magnet in the rotor to align itself with the vector sum of the magnetic fields created by current through the coils. The air core meter rotor angle $\theta_{out}$=arctangent $(V_1/V_2)$ such that the rotor tracks the shaft input angle $\theta_{in}$ on a one for one basis.

29 Claims, 7 Drawing Sheets

U.S. PATENT DOCUMENTS

| | | |
|---|---|---|
| 5,489,842 * | 2/1996 | Lippmann et al. ............... 324/144 |
| 5,525,901 | 6/1996 | Clymer . |
| 5,570,015 | 10/1996 | Takaishi . |
| 5,574,364 | 11/1996 | Kajimoto . |
| 5,602,471 | 2/1997 | Muth . |
| 5,650,721 | 7/1997 | van den Berg . |
| 5,668,331 | 9/1997 | Schintag . |
| 5,684,397 | 11/1997 | Ishishita . |
| 5,796,249 | 8/1998 | Andraet . |
| 5,880,586 * | 3/1999 | Dukart et al. ............... 324/207.2 |
| 6,064,197 * | 5/2000 | Lochmann et al. ............. 324/207.14 |

* cited by examiner

SECTION 3-3

360 DEGREE SHAFT ANGLE SENSING AND REMOTE INDICATING SYSTEM USING A TWO-AXIS MAGNETORESISTIVE MICROCIRCUIT

BACKGROUND OF THE INVENTION

1. Field of Invention

The present invention relates generally to an angular position sensing and indicating system, and more specifically, to a system which includes a contactless arrangement for sensing the angle of rotation of a rotary shaft through 360 degrees of rotation, utilizing magnetoresistive sensors operating in a non-saturating magnetic field, and which is adapted to produce conditioned periodic analog output signals suitable for directly driving a remote electromagnetic shaft position indicator or a relatively simple electronic position indicating apparatus through the full 360 degrees of shaft rotation.

2. Description of the Prior Art

Angular position sensing for 360-degrees of rotation has historically been accomplished using potentiometers, synchros, or resolvers which include low reliability electrical contact arrangements such as electrical brushes and wipers. These devices typically interface with remote position indicating devices which also include potentiometers, synchros, and resolvers.

The need for higher reliability shaft angle sensing for applications such as aircraft control surfaces and closed loop actuators has led to the application of rotary variable differential transformers and absolute encoders which do not rely on a low reliability electrical contact arrangement. Unfortunately, however, these sensors are substantially more expensive and require sophisticated and expensive demodulation electronics to obtain useable output signals.

As a result, efforts to achieve a lower-cost, yet reliable and accurate alternate apparatus for sensing angular position of a rotary shaft have included attempts to utilize sensors such as Hall effect sensors or magnetoresistive (MR) sensors that are capable of generating an electrical output signal when exposed to a rotating magnet field.

Hall effect sensors utilize a current-carrying semiconductor membrane to generate a low voltage perpendicular to the direction of current flow when subjected to a magnetic field normal to the surface of the membrane. Most Hall effect arrangements are digital in nature, and are utilized for sensing shaft speed or incremental angular position with the Hall effect devices acting as switches or pulse generators. See e.g., Kajimoto et al., U.S. Pat. No. 5,574,364. Some devices utilize the Hall sensors to provide an analog output which is linear over a limited range. Complicated ferromagnetic structures are required to maximize the linear range, which has been increased to approximately 80 degrees for the embodiment proposed in Luetzow, U.S. Pat. No. 5,444,369. PCT/EP 98/03149, published Dec. 3, 1998, Int. Pub. No. WO 98/54547, discloses an arrangement using four individual Hall effect sensors carefully arranged on diagonals of a small square under a uniform rotating magnetic field to provide unique output signal combinations over 360 degrees of rotation. In this instance, each Hall effect sensor provides an output voltage proportional to magnetic flux which is dependent on magnet strength and distance from the magnet to the sensor, and an approach similar to EP 0 217 478 B1 (discussed below) for determination of the angle of rotation. When diagonally opposite sensors are used to create differential signals as proposed, the individual Hall effect sensor characteristics must be matched with each other, and they must be positioned and oriented very accurately with respect to each other and to the rotating magnetic field. Use of a ferromagnetic yoke in preferred embodiments to align the magnetic field across the sensors results in additional hysteresis in the output signals.

Magnetoresistive sensors utilize an element whose resistance changes in the presence of a changing external magnetic field. In application to sensing of a rotating magnetic field, MR sensors are conventionally operated in a saturating magnetic field. Magnetic saturation suppresses the effects of changes in magnetic field strength and external magnetic interference (at least below the level that would result in development of a non-saturating field on the sensor) to insure that only rotational change in direction of the sensed magnetic field causes a resistance change in the MR measuring element.

For sensing angular position of shaft rotation of approximately 120 degrees or less, the conventional approach, as well known and documented in the technical literature, is to utilize the substantially linear portion of a sinusoidal output curve. Application of MR sensors to an accurate yet relatively simple and low-cost apparatus for sensing 360 degrees of rotation has, however, proved to be more elusive, primarily because of the fact that such sensors are inherently limited to sensing rotation of only 180 degrees before the amplitude of the sinusoidal output signal repeats.

Inspection of the prior art illustrates several methods attempting to develop an MR sensor apparatus adapted to determine the direction of the changing magnetic field for developing a suitable linear relationship between sensor output and angular rotation through 360 degrees. However, such prior art apparatus tends to be relatively complicated, sensitive to manufacturing tolerances or difficulties, and/or of relatively high cost.

Certain prior MR sensor arrangements utilize angularly spaced magnetoresistive sensors to sense alternating magnetic poles on the circumference of a shaft to detect angular position or rotation of the shaft. However, such an approach is relatively complicated and expensive as the systems are digital in nature and typically require signal generation for sensor input and pulse counters to develop a suitable output signal. See e.g., Kajimoto et al., U.S. Pat. No. 5,574,364 and Suzuki et al., U.S. Pat. No. 4,791,366.

Alternate arrangements position MR sensors in a plane spaced from and parallel to a rotating magnetic field, such as generated by a magnet located at the end of the rotary shaft, and in a substantially uniform portion of the magnetic field. EP 0 217 478 B1, granted Jul. 24, 1991, utilizes two sensor elements supplied with sinusoidal inputs, phase shifted by 90 degrees, for generating 90 degree phase shifted sinusoidal output voltages which are then electronically or digitally combined and manipulated to determine the angle of the shaft. Muth et al., U.S. Pat. No. 5,602,471, issued Feb. 11, 1997, suggests use of an electronic arrangement to generate a family of sinusoidal-shaped curves, and to then generate a family of overlapping linear ramp characteristics (extracted from the linear portions of the sinusoidal curves) from which a linear relationship is developed between sensor output and angular position over 360 degrees. Andrä et al., U.S. Pat. No. 5,796,249 discloses an arrangement of at least three MR sensors, at least one of which is surrounded by an electromagnetic coil energized with an alternating or pulse current to provide the additional directional information needed for angular position sensing through 360 degrees, and to re-shape the natural sinusoidal output curve for a larger linear operating range. Unfortunately, each of these, as well as other related sensor prior art, require additional sensor elements, the addition of an electromagnetic coil, and/or additional signal generators, drive circuitry and complicated output electronics to overcome the sensor limitation of a unique output signal through only 180 degrees of rotation.

Moreover, prior contactless sensing apparatus, including those mentioned above, are generally adapted to providing position indication signal(s) in the form of an electronic or digital signal, that must be further processed or manipulated with additional components if position indication on a remote electromechanical or electromagnetic device is desired.

Thus, it is apparent that there is a long-felt need for an angular position sensing and indicating system comprising a relatively simple, yet reliable and accurate, contactless sensor arrangement adapted to sense 360 degrees of rotation, and to provide an unambiguous output signal or signals suitable for use in indicating the sensed angular position with a relatively simple, yet reliable and preferably contactless electromagnetic, or electronic position indicating apparatus through the full 360 degrees of rotation.

SUMMARY OF THE INVENTION

The general aim of the present invention is to provide a new and improved high reliability, yet relatively simple 360 degree shaft angle position sensing and indicating system comprising a contactless 360 degree position sensor which provides conditioned analog output signals suitable for either directly driving a remote electromagnetic position indicating apparatus, or which can be manipulated according to a relatively simple algorithm for electronic shaft position indication.

A detailed objective is to achieve the foregoing by providing a position sensor equipped with a two-axis magnetoresistive sensor provided with a non-saturating magnetic field that rotates with the shaft, and simple electronic circuitry to condition the output from the magnetoresistive sensor to obtain a pair of voltages having sufficient gain to drive the remote position indicating apparatus, and having equal peak amplitude and a 90 degree phase shift so that the shaft angle is related to the ratio of these two voltages, and more specifically, is equal to the arctangent of the ratio of the voltages. The position sensor output is then communicated to the remote position indicating apparatus capable of converting the voltage ratio into either a mechanical, visual or electronic position indication.

These and other objectives and advantages of the invention will become more apparent from the following description when taken in conjunction with the accompanying drawings.

Briefly, an angular position sensor according to the present invention utilizes a two-axis magnetoresistive sensor and a two pole magnet connected to a rotary shaft for rotation of the magnetic field with the shaft. The magnet is positioned and adapted to provide the magnetoresistive sensor with a low-level non-saturating magnetic field of uniform intensity. The magnetoresistive sensor produces sinusoidal voltage signals offset 90 degrees from one another in response to the angular rotation of the magnetic field. These voltage signals are conditioned with trim resistors and operational amplifiers, for trimming sensor offset voltages, and scaling and amplifying the voltage signals, to obtain the desired conditioned sensor output signals having equal peak amplitude and a 90 degree phase shift. The preferred position sensor includes provision for temperature compensation of the input voltage to the magnetoresistive sensor, and a ferromagnetic housing to shield the magnetoresistive sensor from error producing influences from external magnetic and electromagnetic fields.

Suitable remote position indicating apparatus according to preferred embodiments may be either an electromagnetic or an electronic arrangement capable of converting the ratio of the conditioned position sensor output voltages into mechanical, visual and/or electronic position indication. Accordingly, preferred embodiments contemplate the use of an air core meter comprising a pair of electromagnetic coils energized by the conditioned voltage signals to produce a resultant magnetic flux vector that tracks the angular position of the shaft on a one-for-one basis, and a rotor assembly responsive to said resultant magnetic flux vector to provide visual indication of the angular position of the shaft position and rotation. The invention also contemplates providing the conditioned output signals to analog to digital converters and a microprocessor to generate a digital signal indication or representation of the shaft angular position. This digital signal may then be provided to a visual display unit or other electronic components for further processing.

While the invention is susceptible of various modifications and alternative constructions, certain illustrated embodiments have been shown in the drawings and will be described below in detail. It should be understood, however, that there is no intention to limit the invention to the specific forms disclosed, but on the contrary, the intention is to cover all modifications, alternative constructions, and equivalents falling within the spirit and scope of the invention.

DETAILED DESCRIPTION OF PREFERRED EMBODIMENTS

Figure 1:
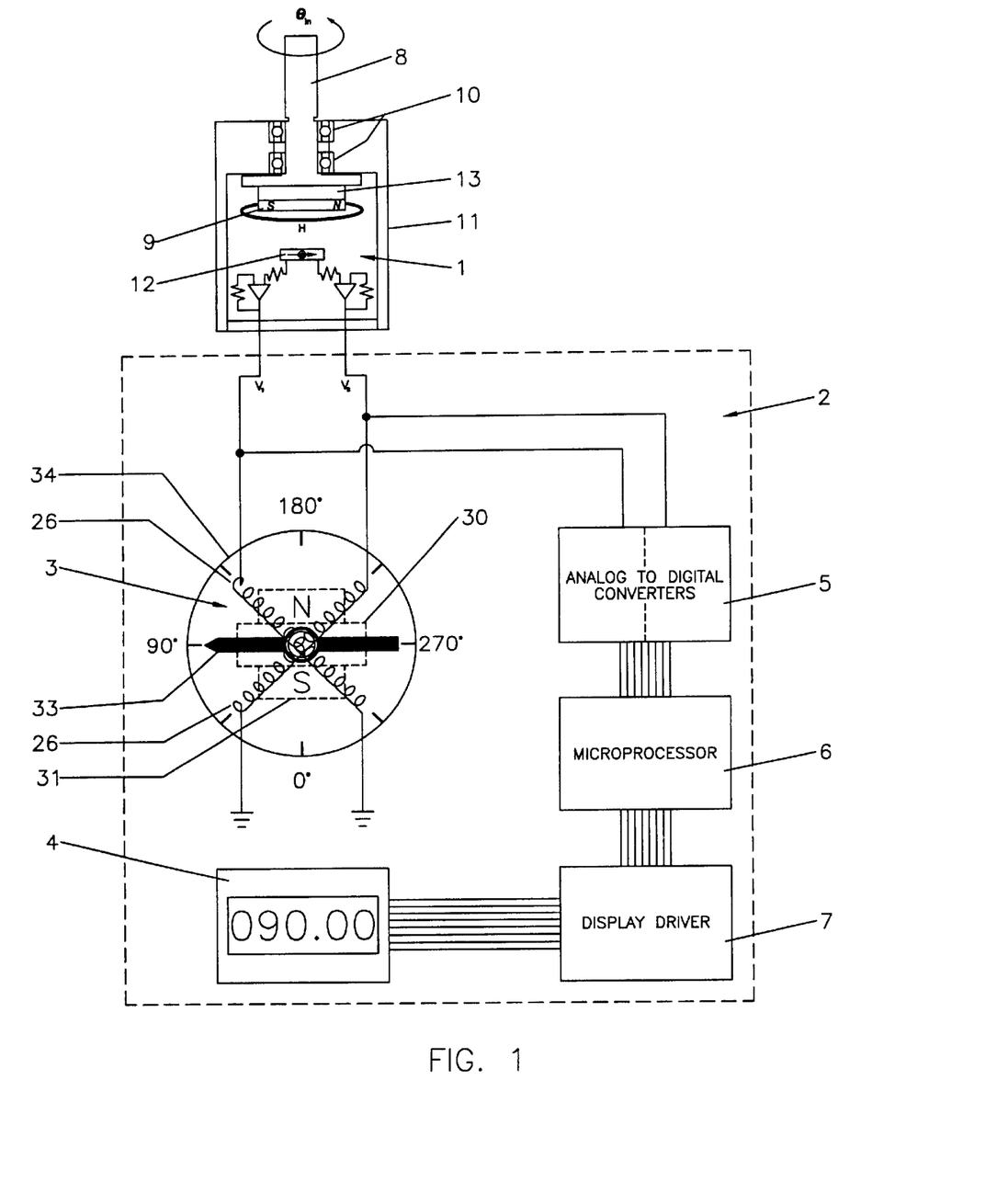
FIG. 1 is a schematic diagram of the overall invention, showing an angular position sensing apparatus and two alternate remote angular position indicating apparatus operably coupled to the position sensing apparatus.

For purposes of illustration, a 360 degree angle sensing and indicating system according to the present invention is shown in FIG. 1 in schematic form. The overall system includes a shaft angle position sensor 1 and a remote position indicating system 2. The remote indicating system 2 shown includes two alternate and independently operable angle position indicating embodiments. Mechanical angle indication is provided by an electromagnetic air core meter 3 with coils sized to be directly driven by the electrical output signal of the position sensor 1. Electronic angle indication is provided by a pair of analog to digital converters 5, a microprocessor 6, a display driver 7, and an associated numerical display unit 4.

Figure 2:
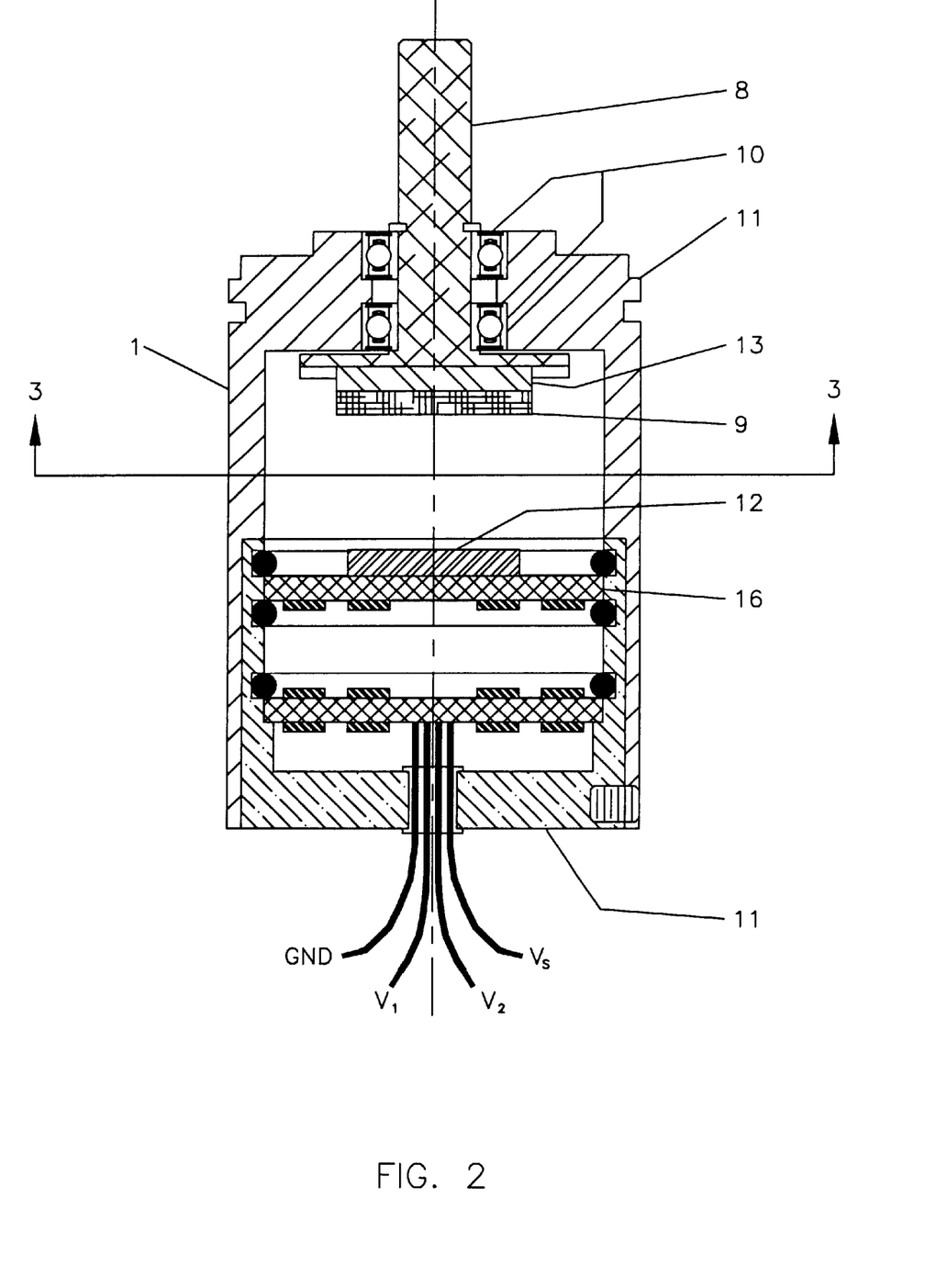
FIG. 2 is a cross-sectional view of a two-axis magnetoresistive shaft-angle position sensor represented in FIG. 1.
Figure 3:
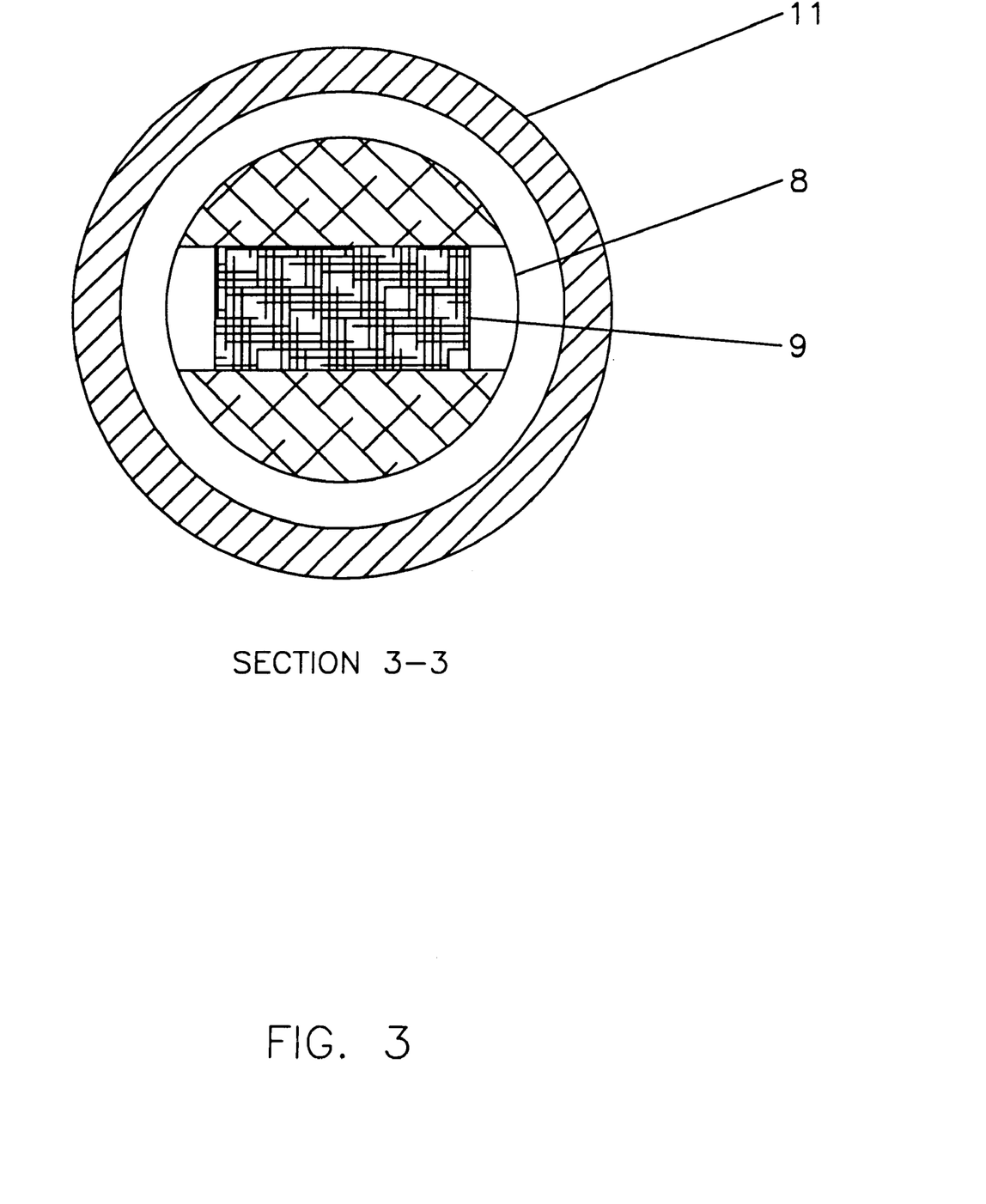
FIG. 3 is a cross-sectional view taken substantially along the line 3—3 of FIG. 2.

Referring to FIGS. 1 and 2, the sensor input shaft 8 is mechanically coupled to an external rotating mechanism (not shown), such as an actuator hinge or a gear, which has an angular orientation $\theta_{in}$ that is desired to be monitored or controlled. The input shaft rotates in a single axis on a pair of suitable bearings 10 which are mounted in a fixed sensor housing 11. The sensor housing is fabricated from a ferromagnetic material to shield the internal sensing elements from interference effects of external magnetic fields such as those created by the Earth or high energy power transmission.

In accordance with the present invention, a 360 degree shaft angle sensing and remote indicating system is implemented using a pair of magnetoresistive sensors 12 to sense the changes in the angular position of a non-saturating rotating magnetic field that rotates with the input shaft 8, and to provide electrical output signals whose ratio is indicative of the angular position $\theta_{in}$ of the input shaft.

Figure 4:
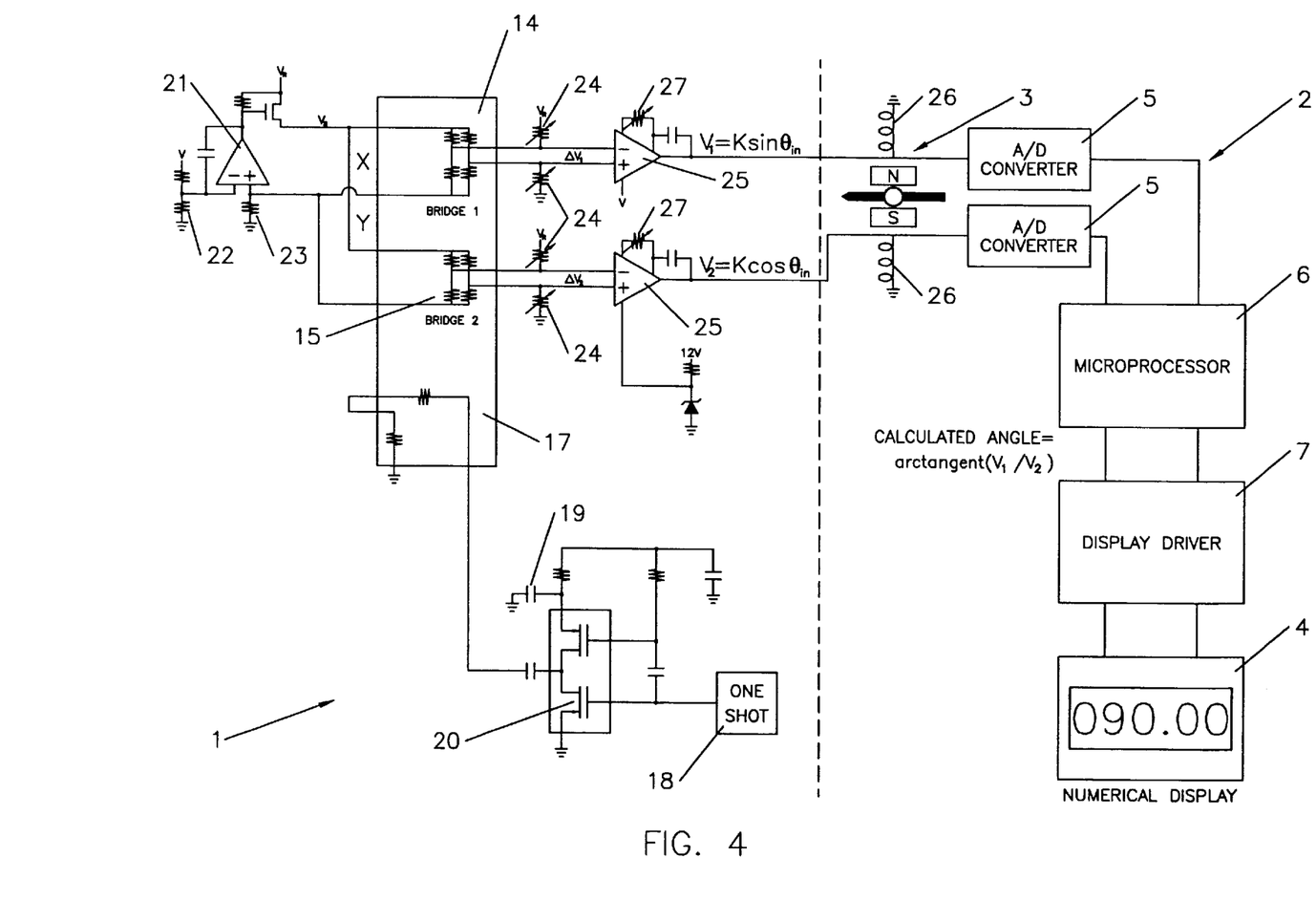
FIG. 4 is a schematic diagram of the electronic driving, sensing, and display circuitry suitable for the position sensing and indicating apparatus of the invention.

In carrying out this aspect of the invention, a permanent magnet 9 is mounted to the input shaft 8 symmetrically about the axis of rotation of the shaft, with the magnetic poles located radially outwardly of the axis as shown in FIGS. 1 and 4 so that the magnetic flux field H (i.e., the lines of magnetic flux) generated by the magnet rotates with the shaft and is generally perpendicular to the axis of shaft rotation.

The direction of the magnetic lines of flux H are sensed by the pair of magnetoresistive sensors 12 mounted with their sensitive axes orthogonal to one another, in a plane parallel with the plane of the rotating magnetic flux vector, and positioned in the plane to insure that the magnetic flux is of substantially uniform intensity and direction across the magnetoresistive sensors. In preferred embodiments, the uniform field acting across the sensors is achieved using a magnet whose length is substantially greater than the length of the MR sensors so that area of the magnetic flux field H resulting from the rotating magnet is substantially greater than the area of the magnetoresistive sensors.

In addition, the magnetoresistive sensors are spaced from the magnet 9 to insure a magnetic flux intensity that will not saturate the sensors. This allows the sensors to operate within the linear input-output operating range for all input shaft angles through 360 degrees of rotation. To this end, a magnetic shunt 13, made of ferromagnetic material, may be connected between the magnet and the input shaft to reduce the intensity of the magnetic flux field acting across the magnetoresistive sensors. The shunt permits the magnetoresistive sensors to be positioned closer to the magnet without saturating, and thus reduces the required length of the sensor housing 11 and the overall sensor 1 length to a length less than would be possible without the shunt.

The preferred embodiment utilizes anisotropic magnetoresistive sensors 12. Anisotropic magnetroresistance occurs in ferrous materials, and is the change of resistance in the material that occurs when a magnetic field is applied perpendicular to the direction of current flow in a thin strip of the material. The resistance in the ferromagnetic material is maximum when the direction of the magnetic field is parallel with the direction of current flow, and is at its minimum with the magnetic field at right angles to the current flow. Referring to FIG. 4, four, preferably, Permalloy (Ni—Fe), resistance elements are configured electrically in each of two Wheatstone bridges 14 and 15. The four resistance elements of each bridge are paired on opposing sides of a rectangle or square, are selected having nominally equal resistance with no magnetic field applied, and are connected to a bridge DC supply voltage $V_s$ that causes current to flow through the resistance elements. Application of the magnetic flux field H across an energized bridge then causes the resistance in one pair of opposed resistance elements to increase and the resistance in the other opposed pair to decrease, resulting in a differential output voltage $\Delta V$ from the bridge. And as the magnetic field rotates with the input shaft 8, a periodic differential output voltage is obtained which, in the linear range of the sensor, is proportional to the intensity of the magnetic field H. The differential output voltage $\Delta V_1$ from bridge 14 is expressed as:

$$\Delta V_1 = H A_1 \sin \theta_{in} + \Delta V_{1\ offset}$$

With bridge 15 oriented at 90 degrees to bridge 14, the differential output voltage $\Delta V_2$ from bridge 15 is expressed as:

$$\Delta V_2 = H A_2 \cos \theta_{in} + \Delta V_{2\ offset}$$

where $A_1$ and $A_2$ are voltage amplitude constants for each bridge, and the offset voltages $\Delta V_{1\ offset}$ and $\Delta V_{2\ offset}$ are the result of nominal bridge resistor element differences due to manufacturing tolerances.

In the preferred embodiment, the resistor elements in the magnetoresistive bridges 14 and 15 are made of Ni—Fe deposited on to a silicon substrate and housed in compact microcircuit package(s) 12 for direct mounting to a circuit board 16, such as is available as Honeywell HMC 1022 magnetoresistive microcircuit with two axes of sensing integral in one narrow-body package. The magnetic field linear operating range of the Honeywell microcircuit is ±6 Gauss, and the package is approximately 0.150 inch wide and 0.400 inch long. This is compatible with the field strength of a relatively small shunted permanent magnet, such as approximately 0.5 inch in length, to produce a uniform non-saturating field across both magnetoresistive sensors. The Honeywell microcircuit also includes a reset strap 17 that is magnetically coupled to the magnetoresistive sensors. A pulse of current through the reset strap realigns the magnetic domains in the resistor elements to provide maximum sensor sensitivity independent of previous magnetic field exposure history. In the embodiment of FIG. 4, the reset current pulse is created by a one-shot circuit 18 which discharges a capacitor 19 through field-effect transistors 20 each time the sensor is energized.

To reduce the effect of ambient temperature change on sensor accuracy, the DC supply voltage $V_s$ provided to the magnetoresistive bridges 14, 15 is adjusted to produce a substantially constant current through the resistor elements independent of temperature. Specifically, a current control amplifier 21 provides and adjusts the supply voltage $V_s$ in response to an input bias voltage, supplied from a regulated reference voltage and resistive divider network 22, minus current feedback voltage across temperature sense resistor 23.

Further in accordance with the invention, the position sensor 1 is adapted to condition the electrical output signals ($\Delta V_1$ and $\Delta V_2$) from the magnetoresistive sensors 12 to provide sensor output signals adapted to directly drive a mechanical angle position indicating apparatus such as air core meter 3, and/or to drive other angle position indicating apparatus, such as numeric display 7, with very little additional signal processing. More specifically, the position sensor 1 is adapted to supply amplified, 90 degree phase shifted output voltage signals ($V_1$ and $V_2$) having equal peak amplitudes.

Figure 5:
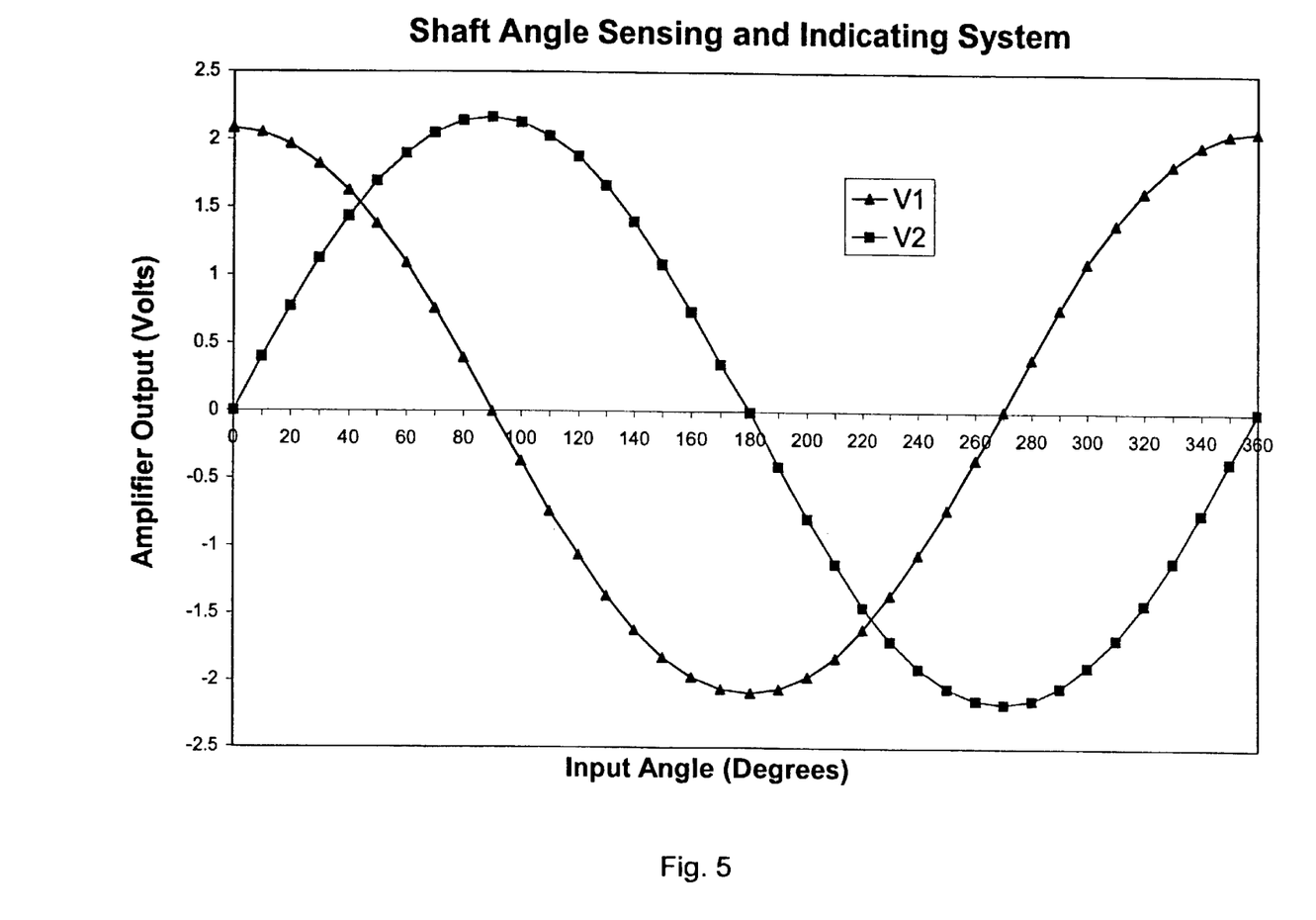
FIG. 5 is a graphical representation of certain amplified position sensor output signals versus the angular position of the sensor input shaft.

In carrying out this aspect of the invention, the null offset voltages ($\Delta V_{1\ offset}$ and $\Delta V_{2\ offset}$) of bridges 14 and 15 with no magnetic field applied are trimmed out using trim resistors 24. The corrected bridge output voltages are then amplified by gain amplifiers 25 to provide output signals of sufficient amplitude and power to directly drive the meter 3 and/or the analog to digital converters 5 without the need for an additional power source. Amplified signal gains are controlled by feedback resistors 27 which are trimmed to provide amplified output voltages $V_1$ and $V_2$ with equal peak amplitudes K. After offset and gain trimming, the conditioned shaft angle sensor 1 output voltages $V_1$ and $V_2$ may be expressed as follows and as shown in FIG. 5:

$$V_1 = K \sin \theta_{in}$$

$$V_2 = K \cos \theta_{in}$$

From this, it is apparent that the angular position $\theta_{in}$ of the shaft 8 is related to the ratio of the sensor output voltages, and may be derived by taking the arctangent of the ratio of the conditioned voltages:

$$V_1/V_2 = (K \sin \theta_{in})/(K \cos \theta_{in}) = \tan \theta_{in}$$

$$\theta_{in} = \arctan(V_1/V_2)$$

Thus, the conditioned output voltage signals $V_1$ and $V_2$ from the sensor 1 can be directly utilized and/or further processed according to a relatively simple algorithm for indicating by determining and/or displaying the angular position $\theta_{in}$ of the input shaft.

Figure 6:
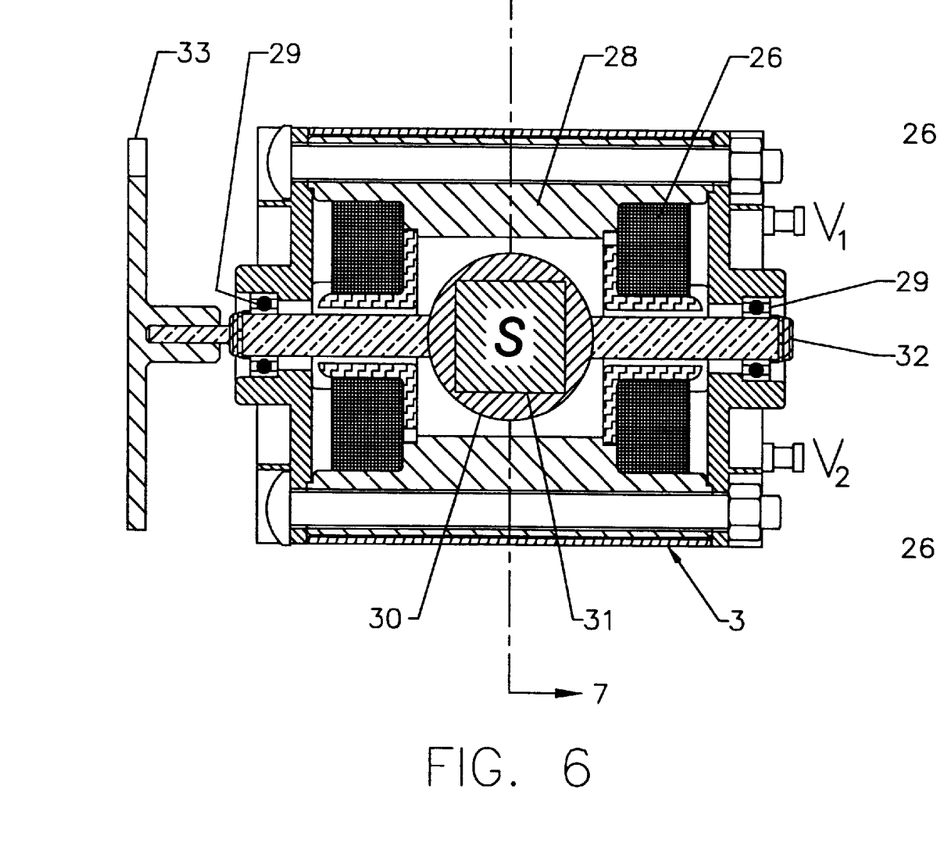
FIG. 6 is a cross-sectional view of an electromagnetic position indicator represented in FIG. 1 for indicating the angular position of the sensor input shaft remote from the sensor.
Figure 7:
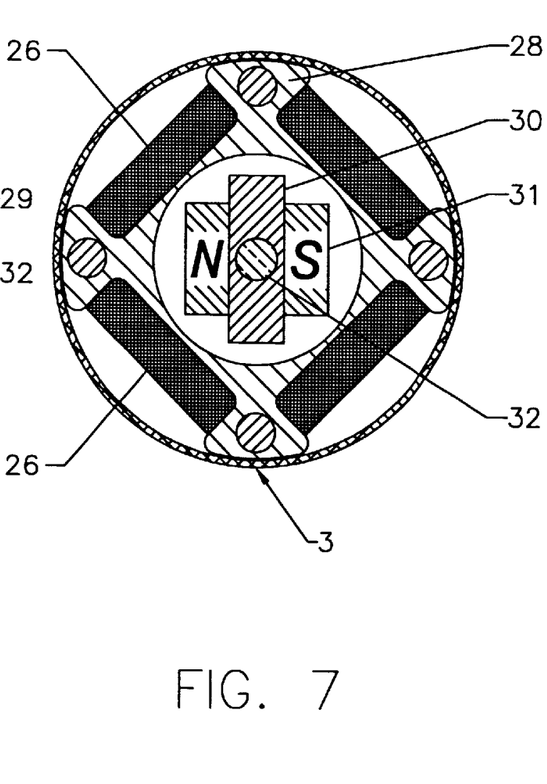
FIG. 7 is a cross-sectional view taken substantially along the line 7—7 of FIG. 6.
Figure 8:
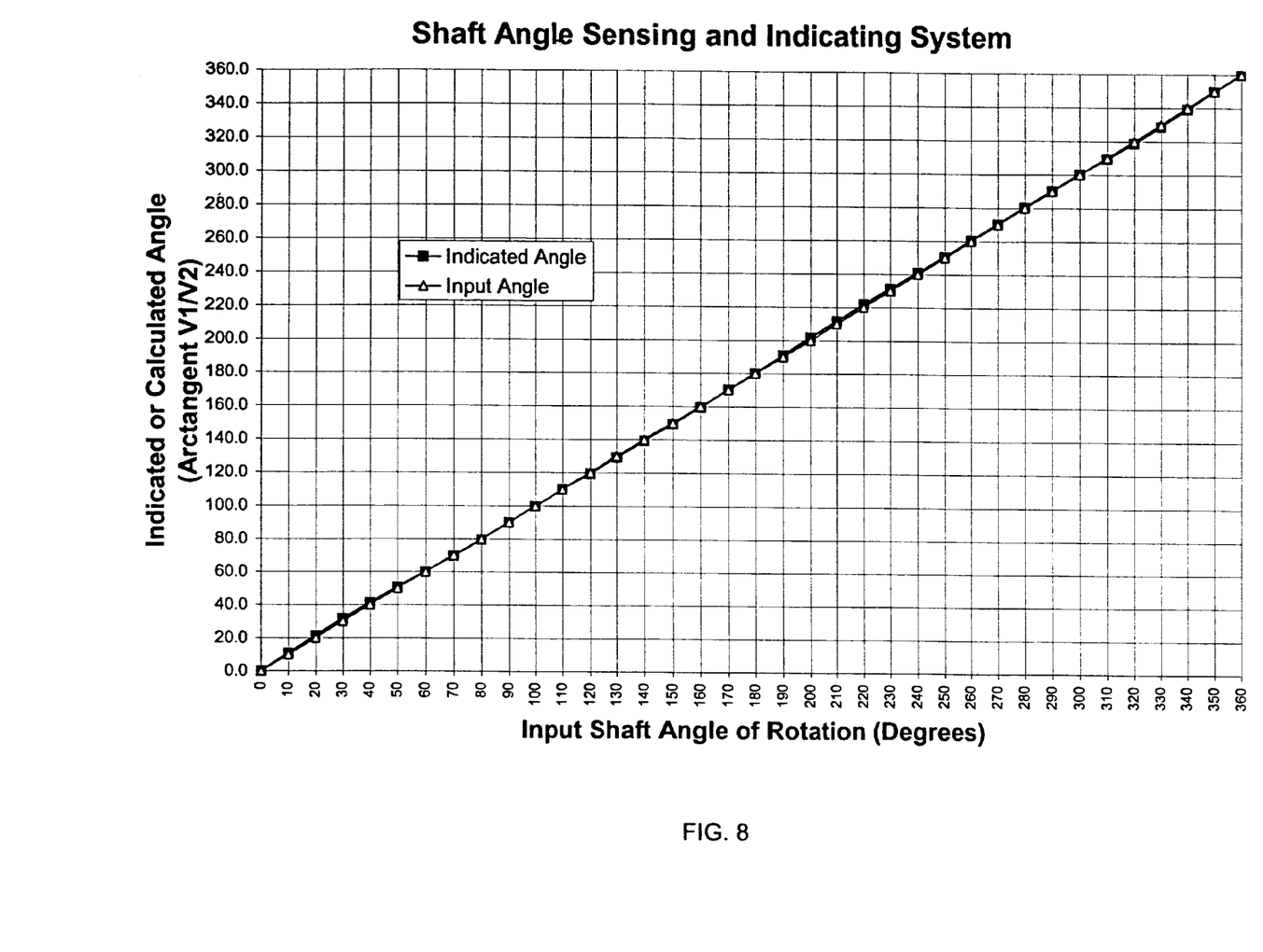
FIG. 8 is a graphical representation of the computed/ indicated shaft angle versus the actual sensor input shaft angle of rotation.

Two alternate embodiments for providing an indication of the of the input shaft angle $\theta_{in}$ from the sensor output voltages $V_1$ and $V_2$ are presented in the drawings. The first embodiment illustrates the use of electromagnetic torque resulting from directly energizing a pair of coils 26 with the sensor output voltages $V_1$ and $V_2$ to angularly displace a position indicating pointer 33 in a one-to-one ratio with the angular rotation of the sensor input shaft 8. Referring to FIGS. 1 and 6–7, the electromagnetic meter 3 includes a nonferrous, nonmagnetic coil housing 28 which contains suitable cavities for a pair of conductive wire coils 26 to be wound around the housing. The coils contain sufficient turns to develop an electromagnetic field of suitable strength and with resistance compatible with the sensor gain amplifiers 25. The coil housing also contains means for securing a pair of rotor bearings 29 and enclosing a rotor 30 which moves in response to the electromagnetic fields developed in the coils. The rotor consists of a two pole permanent magnet 31 fixed to a rotor shaft 32 which is supported by bearings 29. The poles of the permanent magnet assembly face radially outward to create a torque on the rotor when the poles are not aligned with the vector sum of the magnetic field created by energizing the coils. The rotor is in equilibrium when the permanent magnet poles are in alignment with the vector sum of the magnetic fields from the coils.

The magnetic fields created in the two coils 26 by directly energizing the coils with the sensor output voltages $V_1$ and $V_2$ can be expressed as:

$$H_1 = MN_1 i_1 = MN_1 V_1/R_1$$

$$H_2 = MN_2 i_2 = MN_2 V_2/R_2$$

where subscripts 1 and 2 denote each of the two coils 26, H is the magnetic flux in the respective coil, M is a magnetic constant, N is the number of turns in the coil, i is the current through the coil, and R is the coil resistance.

If both coils are wound with the same number of turns and with wire of the same resistance per unit length, then $N_1 = N_2$ and $R_1 = R_2$, and:

$$H_1 = MNV_1/R$$

$$H_2 = MNV_2/R$$

Substituting the sensor output voltage $V_1 = K \sin \theta_{in}$ and $V_2 = K \cos \theta_{in}$ results in development of the following magnetic flux vectors in the coils 26:

$$H_1 = (KMN/R) \sin \theta_{in}$$

$$H_2 = (KMN/R) \cos \theta_{in}$$

Thus, the direction of the resultant flux vector created by energizing coils 26 is:

$$\theta_{out} = \arctan(H_1/H_2) = \arctan[((KMN/R)\sin \theta_{in})/((KMN/R)\cos \theta_{in})]$$

or:

$$\theta_{out} = \arctan(\tan \theta_{in}) = \theta_{in}$$

Thus, the resultant electromagnetic field vector from the coils 26 of the air core meter 3 follows the input shaft angle $\theta_{in}$ in a one-to-one angular ratio. Since the rotor 30 and the pointer 33 follow the resultant electromagnetic field, they also track or repeat the input shaft angle on a one for one basis. In other words, the meter 3 acts to magnetically compute and indicate the shaft angle $\theta_{in}$ without the need for an external electrical power supply or additional electrical apparatus. An angle indicating dial or scale 34 attached to the meter body provides a fixed angular position indicating reference for $\theta_{in}$ as the pointer 33 rotates.

The second embodiment shown for indicating input shaft angle $\theta_{in}$ utilizes electronic means for manipulating the sensor output voltages, and specifically for calculating the arctangent of sensor 1 output voltages $V_1/V_2$, for displaying shaft angle $\theta_{in}$. In this instance, the sensor output signals are input to a pair of analog to digital converters 5 and converted to a digital number representing their respective amplitudes. These numbers serve as inputs to a microprocessor 6, such as Motorola MC68HC711D3CP2 or equivalent. The arctangent of the ratio of these numbers is then calculated by the microprocessor utilizing a combination of look-up tables, numerical computation, and software according to conventional algorithms known to those skilled in the art. The microprocessor output is the arctangent of the ratio of the two input numbers, which is directly proportional to the input shaft angle $\theta_{in}$. The microprocessor digital output is then scaled and converted to the appropriate digital format by a display driver 7, such as Harris ICM7224IPL or equivalent, to drive a liquid crystal, light emitting diode, or other suitable numerical display 4 which indicates the input shaft angle $\theta_{in}$ in degrees or other angular displacement units. It will be apparent to those skilled in the art that the output signal from the microprocessor may also be tapped for use in, for example, an electronic control system for controlling the shaft angle $\theta_{in}$. Advantageously, the analog electromagnetic meter 3 and the electronic digital display 4 may be both provided and located in a common housing, and require only the conditioned voltage signals $V_1$ and $V_2$, and a DC supply voltage, to sense and repeat or indicate input shaft angle $\theta_{in}$.

It will be apparent to those skilled in the art that the conditioned output signals $V_1$ and $V_2$ of the sensor 1 may also be provided within the scope of the present invention to other apparatus capable of manipulating the voltage ratio, or the arctangent of the voltage ratio, for indicating the angular position of the shaft to such apparatus, such as to components in a safety system adapted to monitor shaft position, or a control system for controlling the shaft position and/or speed with additional time derivative calculations.

From the foregoing, it will be apparent that the present invention brings to the art a new and improved apparatus for sensing and indicating the angular position $\theta_{in}$ of a rotary shaft. By virtue of operating a pair of magnetoresistive sensors within a uniform, relatively low-lever, non-saturating magnetic field that rotates with the shaft, the output voltages stay within the linear operating range of the magnetoresistive sensor, eliminating sources of error and associated compensating apparatus of prior angle sensing and indicating arrangements. By trimming and amplifying these output voltage signals to a suitable level having equal peak amplitudes, the resultant signals can be directly utilized, such as with an electromagnetic meter 3, or easily manipulated for use, such as with an electronic display system, for indicating the angular position of the shaft. Thus, the present invention provides a unique, relatively low cost, yet high reliability and accurate contactless arrangement for sensing and indicating the angular position of a rotating shaft previously unavailable in the art.

We claim:

1. Apparatus for sensing and indicating the angular position of a first rotor mounted for 360 degree rotation about a first axis, the apparatus comprising:

a pair of stationary magnetoresistive sensors having magnetically sensitive axes at right angles to each other;

two-pole permanent magnet means connected for rotation with the rotor and axially spaced from said sensors for generating a non-saturating rotating magnetic field of substantially uniform intensity across said sensors with magnetic shunt as the rotor rotates through 360 degrees of rotation;

means for shielding the sensors from external magnetic sources;

first circuit means for supplying an input voltage to the sensors, said input voltage resulting in a pair of periodic output voltages offset by 90 degrees phase shift and associated with respective ones of said sensors;

second circuit means for conditioning said output voltages to produce a pair of associated conditioned voltage signals proportional to the periodic sine and cosine of the rotor angle; and means for indicating the rotor angle through 360 degrees of rotation formulated from a continuous non-linear function of the ratio of said conditioned voltage signals with aircore meter.

2. Apparatus as defined in 1 in which said magnetic means includes a magnetic shunt positioned to assist in generating the non-saturating magnetic field across the sensors.

3. Apparatus as defined in claim 1 in which said first circuit means includes temperature compensation means for adjusting the input voltage to said sensors.

4. Apparatus as defined in claim 1 in which said second circuit means is adapted to generate conditioned voltages having equal peak amplitudes, and said indicating means is adapted to formulate the rotor angle from the arctangent of the ratio of said conditioned voltage signals.

5. Apparatus as defined in claim 4 in which said second circuit means includes variable bias resistor means for nulling out sensor offset voltages to provide symmetrical output voltages with respect to a reference voltage.

6. Apparatus as defined in claim 4 in which said second circuit means includes variable gain resistor means to assist in matching the peak amplitude of said conditioned voltage signals.

7. Apparatus as defined in claim 1 in which said second circuit means includes operational amplifier means for producing said conditioned voltage signals sufficient to drive said indicating means.

8. Apparatus as defined in claim 7 in which said indicating means includes a second rotor mounted for rotation about a second axis, a pair of coils wound at right angles to each other and wound substantially around the second rotor along said second axis, the coils receiving respective ones of said conditioned voltage signals, the second rotor being rotationally responsive to the electromagnetic field developed by the coils from said conditioned voltage signals, and pointer means connected for rotation with the second rotor for visually indicating the angle of the shaft.

9. Apparatus as defined in claim 8 in which the resultant magnetic field vector angle developed by said coils is proportional to the arctangent of the ratio of said conditioned voltage signals such that the second rotor and pointer rotate in a one-to-one angular relationship with the angle of the first rotor through 360 degrees of rotation.

10. Apparatus as defined in claim 1 in which said indicating means includes electronic angle calculating means comprising analog to digital converter means receiving said conditioned voltage signals and generating a digital representations thereof, and a microprocessor receiving said digital representations and generating a digital signal associated with the arctangent of the ratio of said digital representations.

11. Apparatus as defined in claim 10 in which said indicating means includes electroluminescent numerical display means receiving said digital signal for indicating the angle of the first rotor.

12. Apparatus for sensing the angular position of a first rotor mounted for 360 degrees of rotation about a first axis, the apparatus comprising:

a pair of stationary magnetoresistive Wheatstone bridge sensors;

permanent magnet means connected for rotation with the rotor and positioned to alter the resistance of the sensors according to associated periodic sinusoidal functions as the rotor rotates through 360 degrees of rotation;

first circuit means for supplying an input voltage to the sensors, said input voltage resulting in a pair of periodic output voltages associated with respective ones of said periodic functions;

second circuit means for conditioning said output voltages to produce a pair of associated conditioned voltage signals proportional to the periodic sine and cosine of the rotor angle and having equal peak amplitudes; and means for indicating the rotor angle through 360 degrees of rotation characterized by formulation of the arctangent of the ratio of said conditioned voltage signals over the entire 360 degrees of rotation.

13. Apparatus as defined in claim 12 in which said magnet means includes a two pole magnet for creating a rotating magnetic field perpendicular to said first axis as the first rotor rotates, and in which said sensors are located in a plane parallel to the magnetic flux field of the magnet.

14. Apparatus as defined in claim 13 in which the sensors are positioned having magnetic sensitive axis at right angles to each other and in a non-saturating location of substantially uniform intensity in the magnetic field.

15. Apparatus as defined in 14 further comprising a magnetic shunt connected for rotation with the magnet and positioned to reduce the magnetic flux density across the sensors to a level below the saturation limit of the sensors.

16. Apparatus as defined in claim 12 in which the output voltages from the sensors vary according to the sine and cosine of the rotor angle.

17. Apparatus as defined in claim 12 in which said first circuit means includes temperature compensation means for adjusting the input voltage to the sensors.

18. Apparatus as defined in claim 12 in which said second circuit means includes operational amplifier means for producing conditioned voltage signals sufficient to drive said indicating means.

19. Apparatus as defined in claim 18 in which said indicating means includes a second rotor mounted for rotation about a second axis, a pair of coils wound at right angles to each other and wound substantially around the second rotor along said second axis, the coils receiving respective ones of said conditioned voltage signals, the second rotor being rotationally responsive to the electromagnetic field developed by the coils from said conditioned voltage signals, and pointer means connected for rotation with the second rotor for visually indicating the angle of the first rotor.

20. Apparatus as defined in claim 19 in which the electromagnetic field vector angle developed by said coils is proportional to the arctangent of the ratio of said conditioned voltage signals such that the second rotor and the pointer rotate in a one-to-one angular relationship with the angle of the first rotor through 360 degrees of rotation.

21. Apparatus as defined in claim 12 in which said indicating means includes electronic angle calculating means comprising analog to digital converter means receiving said conditioned voltage signals and generating digital representations thereof, and a microprocessor receiving said digital representations and generating a digital signal associated with the arctangent of the ratio of said digital representations.

22. Apparatus as defined in claim 21 in which said indicating means includes electroluminescent numerical display means receiving the digital signal for indicating the angle of the first rotor.

23. Apparatus as defined in claim 12 in which said second circuit means includes variable bias resistor means for nulling out sensor offset voltages to provide symmetrical output voltages with respect to a reference voltage.

24. Apparatus as defined in claim 12 in which said second circuit means includes variable gain resistor means to assist in matching the peak amplitude of said conditioned voltage signals.

25. Apparatus for sensing the angular position of a rotatable shaft mounted for rotation through 360 degrees of rotation about a first axis, the apparatus comprising:

a pair of magnetoresistive Wheatstone bridge sensors having magnetically sensitive axes oriented at right angles to each other and to said axis of rotation;

a two-pole magnet mounted for rotation about said axis with the shaft, said magnet being sized and positioned to generate a non-saturating magnetic field of substantially uniform intensity across said sensors;

means for shielding the sensors from external magnetic sources;

first circuit means for supplying an input voltage to the sensors, said input voltage resulting in a pair of periodic output voltages associated with respective ones of said sensors;

second circuit means for conditioning the output voltage from said sensors to produce a pair of conditioned voltage signals proportional to the periodic sine and cosine of the shaft angle and having equal peak amplitudes; and means for indicating the shaft angle formulated from the arctangent of the ratio of said conditioned voltage signals, said indicating means including one of electromechanical means for providing a visual indication of the shaft angle and microprocessor means for providing a digital representation of the shaft angle.

26. Apparatus for sensing and indicating the angular position of a shaft mounted for 360 degrees of rotation, the apparatus comprising:

a pair of magnetoresistive sensors;

a magnet connected for rotation with the shaft and positioned to alter the resistance of the sensors according to associated periodic sinusoidal functions as the rotor rotates through 360 degrees of rotation;

a magnetic shield encasing the sensors to shield the sensors from external magnetic interference effects;

a magnetic shunt connected for rotation with the shaft and positioned in the shield to assist in generating a non-saturating magnetic field of substantially uniform intensity across the sensors as the shaft rotates;

an input voltage source connected to the sensors, the input voltage resulting in a pair of periodic sensor output voltages associated with respective ones of said periodic resistance functions;

a signal conditioning circuit adapted to condition said output voltages to produce a pair of associated conditioned output voltage signals of equal peak amplitude and proportional to the periodic sine and cosine of the shaft angle; and an angle position indicator responsive to the magnitude of said conditioned output voltages and operative to indicate the angular position of the shaft therefrom.

27. Apparatus as defined in claim 26 in which said magnet is positioned intermediate the sensors and the magnetic shunt.

28. Apparatus for sensing and indicating the angular position of a shaft mounted for 360 degrees of rotation about a first axis, the apparatus comprising:

a pair of magnetoresistive sensors;

a magnet connected for rotation with the shaft and positioned to alter the resistance of the sensors according to associated periodic sinusoidal functions as the rotor rotates through 360 degrees of rotation;

an input voltage source connected to the sensors, the input voltage resulting in a pair of periodic sensor output voltages associated with respective ones of said periodic resistance functions;

a signal conditioning circuit adapted to condition said output voltages to produce a pair of associated conditioned output voltage signals of equal peak amplitude and proportional to the periodic sine and cosine of the shaft angle; and an air core meter including (i) a pair of coils receiving respective ones of said conditioned output voltage signals, and (ii) a rotor mounted for rotation about a second axis remote from the first axis, the rotor being rotationally responsive to the electromagnetic field developed in the coils from said conditioned voltage signals for visually indicating the angular position of the shaft.

29. Apparatus as defined in claim 28 in which the resultant magnetic field vector angle developed in said coils is proportional to the arctangent of the ratio of said conditioned voltage signals such that the second rotor rotates in a one-to-one angular relationship with the angle of the shaft through 360 degrees of rotation.

* * * * *